(12) United States Patent
Joshi et al.

(10) Patent No.: US 11,319,639 B2
(45) Date of Patent: May 3, 2022

(54) METHODS FOR FORMING A FLAT SURFACE MIO STRUCTURE

(71) Applicants: TOYOTA MOTOR ENGINEERING & MANUFACTURING NORTH AMERICA, INC., Plano, TX (US); THE BOARD OF TRUSTEES OF THE UNIVERSITY OF ILLINOIS, Champaign, IL (US)

(72) Inventors: Shailesh N. Joshi, Ann Arbor, MI (US); Paul Braun, Champaign, IL (US); Gaurav Singhal, Maharashtra (IN)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 170 days.

(21) Appl. No.: 16/777,488

(22) Filed: Jan. 30, 2020

(65) Prior Publication Data
US 2021/0238761 A1    Aug. 5, 2021

(51) Int. Cl.
*C25D 5/48* (2006.01)
*C25D 5/56* (2006.01)
(Continued)

(52) U.S. Cl.
CPC .................. *C25D 5/48* (2013.01); *C25D 5/02* (2013.01); *C25D 5/56* (2013.01); *C25D 7/12* (2013.01);
(Continued)

(58) Field of Classification Search
None
See application file for complete search history.

(56) References Cited

U.S. PATENT DOCUMENTS

| 10,347,601 | B1 | 7/2019 | Dede et al. |
| 2013/0149492 | A1* | 6/2013 | Yoon ...................... B29C 67/20 428/137 |

(Continued)

FOREIGN PATENT DOCUMENTS

| CN | 102225336 A | 10/2011 |
| CN | 102173862 B | 2/2013 |

(Continued)

OTHER PUBLICATIONS

Gaulding et al.; "Fabrication and Optical Characterization of Polystyrene Opal Templates for the Synthesis of Scalable, Nanoporous (Photo) Electrocatalytic Materials by Electrodeposition"; Journal of Materials Chemistry A, 5(23); Mar. 2, 2017; 16 pgs.

(Continued)

*Primary Examiner* — Louis J Rufo
(74) *Attorney, Agent, or Firm* — Dinsmore & Shohl LLP (57) ABSTRACT

Embodiments of the disclosure relate to methods for forming a flat surface MIO structure for bonding and cooling electronic assemblies. In one embodiment, the method includes providing a plurality of particles on a surface of a base substrate. A metal is then deposited onto the plurality of particles up to a desired level to form a metal layer such that the plurality of particles is partially covered by the metal layer. An adhesive member is then applied to the plurality of particles exposed above the metal layer. Finally the adhesive member is pulled to remove individual particles of the plurality of particles that are exposed above the metal layer.

18 Claims, 9 Drawing Sheets

(51) Int. Cl.
*C25D 5/02* (2006.01)
*H01L 23/00* (2006.01)
*C25D 7/12* (2006.01)

(52) U.S. Cl.
CPC .... H01L 24/27 (2013.01); *H01L 2224/03462* (2013.01); *H01L 2924/01013* (2013.01); *H01L 2924/01028* (2013.01); *H01L 2924/161* (2013.01)

(56) References Cited

U.S. PATENT DOCUMENTS

| | | | |
|---|---|---|---|
| 2014/0011014 A1* | 1/2014 | King | C25D 7/00 428/312.2 |
| 2019/0229083 A1 | 7/2019 | Joshi et al. | |

FOREIGN PATENT DOCUMENTS

| | | |
|---|---|---|
| KR | 101625485 B1 | 5/2016 |
| WO | 2016009249 A1 | 1/2016 |

OTHER PUBLICATIONS

"Metal Inverse Opals Could Better Cool Electronics"; Electronics Cooling; Apr. 18, 2016; 8 pgs. (https://www.electronics-cooling.com/2016/01/metal-inverse-opals-could-better-cool-electronics/).
Gilbert N. Mbah; "Three-Dimensional Scaffolds of Graphene, Carbon Nanotubes and Transition-Metal Oxides for Applications in Electronics, Sensors and Energy Storage"; University of Nebraska—Lincoln; Aug. 2015; 134 pgs.

\* cited by examiner

METHODS FOR FORMING A FLAT SURFACE MIO STRUCTURE

TECHNICAL FIELD

The present specification generally relates to methods of forming a bonding structure for electronic assemblies and, more specifically, to methods for forming a flat surface MIO structure for bonding and cooling electronic assemblies.

BACKGROUND

As electronic assemblies are designed to operate at increased power levels, they generate high heat flux due to the demands of electrical systems. This requires that bonds between the electronic device and the substrate in the electronic assemblies be able to withstand higher temperatures and thermally-induced stresses due to mismatch of coefficient of thermal expansion (CTE) between the electronic device and the substrate. Some bonding layers, such as transient liquid phase (TLP) layers are brittle and can crack due to this CTE mismatch.

Conventional heat sinks are unable to adequately remove sufficient heat to effectively lower the operating temperature of the electronic assemblies to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronic modules challenging. Accordingly, it is desirable to have bonding structures that can act as efficient thermal management solutions when electronic assemblies are thermally coupled thereto.

SUMMARY

The present specification relates to methods for forming a flat surface MIO structure for bonding and cooling electronic assemblies. In one embodiment, the method includes providing a plurality of particles on a surface of a base substrate. A metal is then deposited onto the plurality of particles up to a desired level to form a metal layer such that the plurality of particles is partially covered by the metal layer. An adhesive member is then applied to the plurality of particles exposed above the metal layer. Finally, the adhesive member is pulled to remove individual particles of the plurality of particles that are exposed above the metal layer.

In another embodiment, a method of forming a flat surface MIO structure includes providing a plurality of polystyrene particles on a surface of a base substrate. A metal is then electrodeposited onto the plurality of polystyrene particles up to a desired level to form a metal layer such that the plurality of polystyrene particles is partially covered by the metal layer. An adhesive member is applied to the plurality of polystyrene particles exposed above the metal layer. The adhesive member is then pulled to remove individual polystyrene particles of the plurality of polystyrene particles that are exposed above the metal layer. Finally, a cap layer is formed above the metal layer with further deposition of the metal above the plurality of voids.

In yet another embodiment, a method of forming a flat surface MIO structure includes providing a plurality of particles on a surface of a base substrate. The plurality of particles are core-shell phase change (PC) particles, where each core-shell PC particle comprises a core comprising a phase change material (PCM) with a melting point between about 100° C. and about 250° C. and a shell material having a melting point greater than the melting point of the core. A metal is electrodeposited onto the plurality of particles up to a desired level to form a metal layer such that the plurality of particles is partially covered by the metal layer. An adhesive member is applied to the plurality of particles exposed above the metal layer. Finally, the adhesive member is pulled to remove individual particles of the plurality of particles that are exposed above the metal layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments described herein are directed to methods for forming a flat surface metal inverse opal (MIO) structure, where the flat surface may be used to grow a cap layer and/or bond an electronic device. MIO structures are metal porous structures that provide unique combinations of large surface to volume ratios, high conductivity, and mechanical compliance. Electronic devices, particularly those utilized in vehicular applications may generate a significant amount of heat when operating at high temperatures. This requires bonds between the electronic devices and substrates that can withstand higher temperatures and thermally-induced stresses and prevent cracking due to CTE mismatch. The flat surface MIO structures described and illustrated herein may compensate for the thermally-induced stresses generated during thermal bonding of the electronic devices to the substrate by manageably controlling the thermal expansion and/or stiffness experienced by the layers of the substrate and electronic devices while also providing a compact package design. The porous nature of MIO structures make them useful in two-phase cooling applications by providing high surface area for contact with a cooling medium and allowing for many nucleation sites for boiling. Thus the integration of MIO structures in electronic assemblies can improve heat exchange for high heat flux thermal management. Various aspects of the disclosure and variations thereof are illustrated or implied through the descriptions of the embodiments below.

Figure 1:
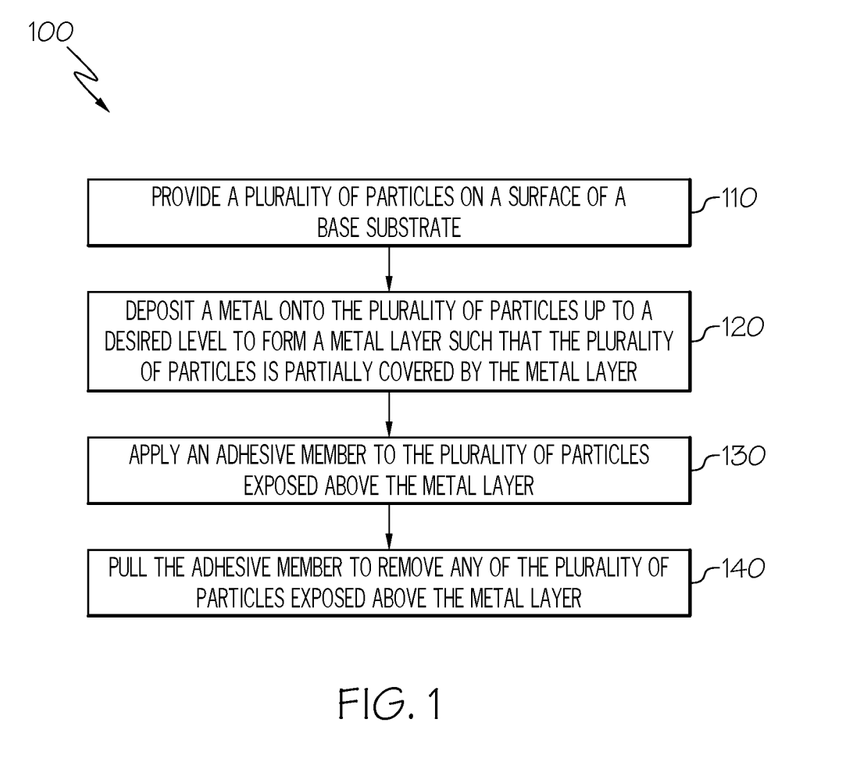
FIG. 1 depicts a block diagram of an example method of forming a flat surface MIO structure comprising a plurality of particles embedded in a metal layer, according to one or more embodiments shown and described herein.

FIG. 1 depicts a block diagram of an example method 100 of forming a flat surface MIO structure comprising a plurality of particles embedded in a metal layer. The example method 100 can be incorporated as part of an automated assembly process using machinery having one or more apparatuses. The machinery may be a single multi-function equipment having all the apparatuses above or a multiple single-function apparatuses positioned at different stations. The steps 110-140 of the method 100 can be best understood in conjunction with FIGS. 2-5, which depict various stages of forming the flat surface MIO structure.

In step 110, a plurality of particles are provided on a surface of a base substrate. The example embodiment shown in FIG. 2 demonstrates this step 110. A base substrate 210 is used for making the MIO structure 700 (shown in FIG. 7). The base substrate 210 is set on a platform that may be configured to travel through the automated assembly process. The base substrate 210 may be formed from any suitable electrically-conductive metal or metal alloy for electrodeposition, such as, but not limited to, copper (Cu), oxygen-free Cu, aluminum (Al), Cu alloys, Al alloys, direct-bonded-copper substrates, and the like. In some embodiments, the substrate 210 may be plated with a metal on an exterior surface such as, for example, aluminum (Al), nickel (Ni), and the like. As will be described in greater detail herein, the substrate 210 may be formed from a thermally-conductive material for transferring heat from an electronic device 140 bonded to the substrate 210.

Figure 2:
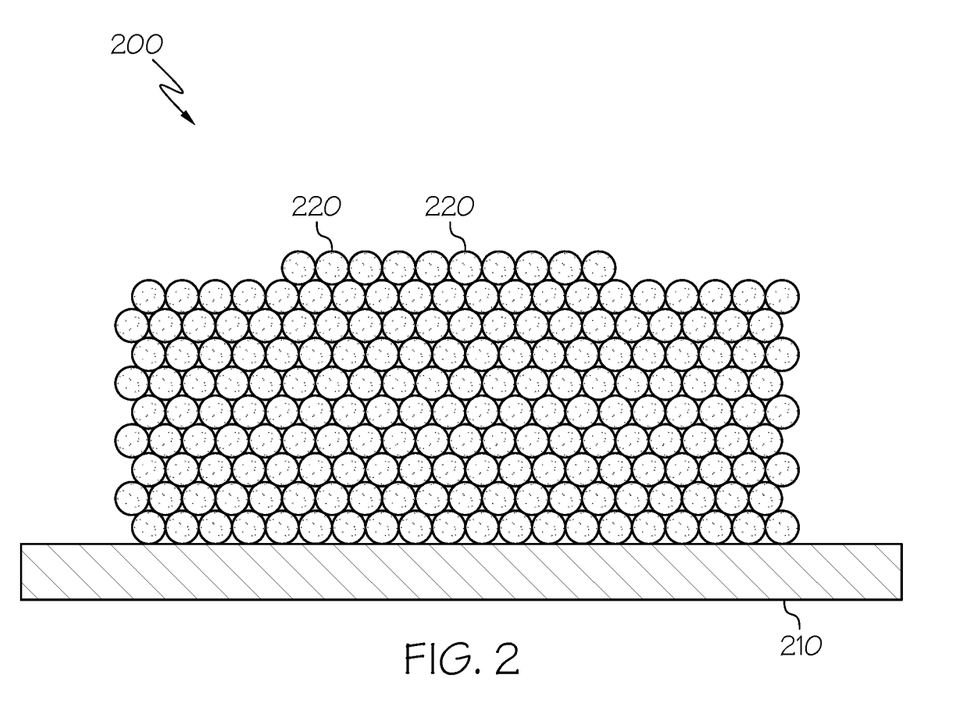
FIG. 2 depicts a method step of providing a plurality of particles on a surface of a base substrate, according to one or more embodiments shown and described herein.
Figure 3:
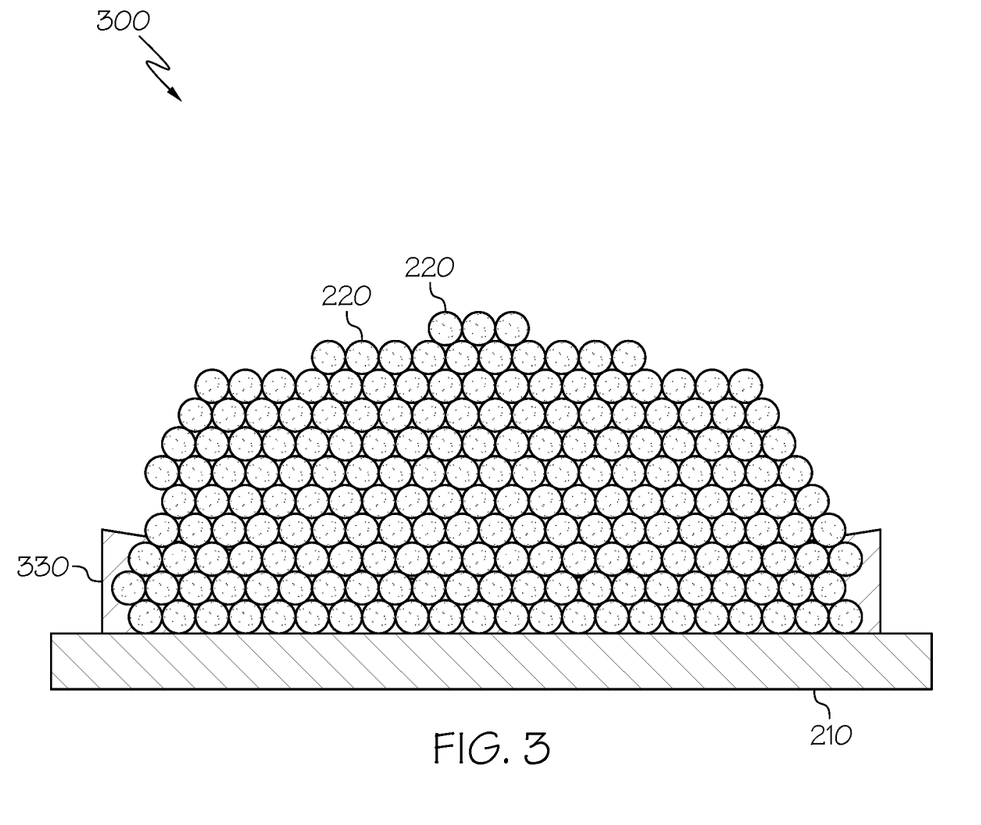
FIG. 3 depicts a method step of depositing a metal onto the plurality of particles of FIG. 2, according to one or more embodiments shown and described herein.

A plurality of particles 220 is provided on the base substrate 210 using, as a non-limiting example a machine-operated arm of an apparatus used in the machinery. As will be described in greater detail below, the plurality of particles 220 are subsequently removed after formation of a metal layer 550 (shown in FIG. 5) over them to form a plurality of voids 720 (shown in FIG. 7). In some embodiments, the plurality of particles 220 is formed from polystyrene. Each of the plurality of polystyrene particles 220 may have a spherical shape and thus leave behind voids that are spherical in shape upon removal from the metal layer 550. The porosity of the resultant MIO structure 700 (shown in FIG. 7) may be varied during fabrication by changing the size of the plurality of particles 220. Further, the size of the plurality of voids 720 of the MIO structure 700 may be varied as a function of the thickness of the MIO structure 700 such that a graded porosity, (i.e. graded pore diameter) is provided as a function of thickness. The size (diameter) of the plurality of particles 220 may be selected such that the plurality of voids 720 meets a desired porosity of the MIO structure 700.

Figure 7:
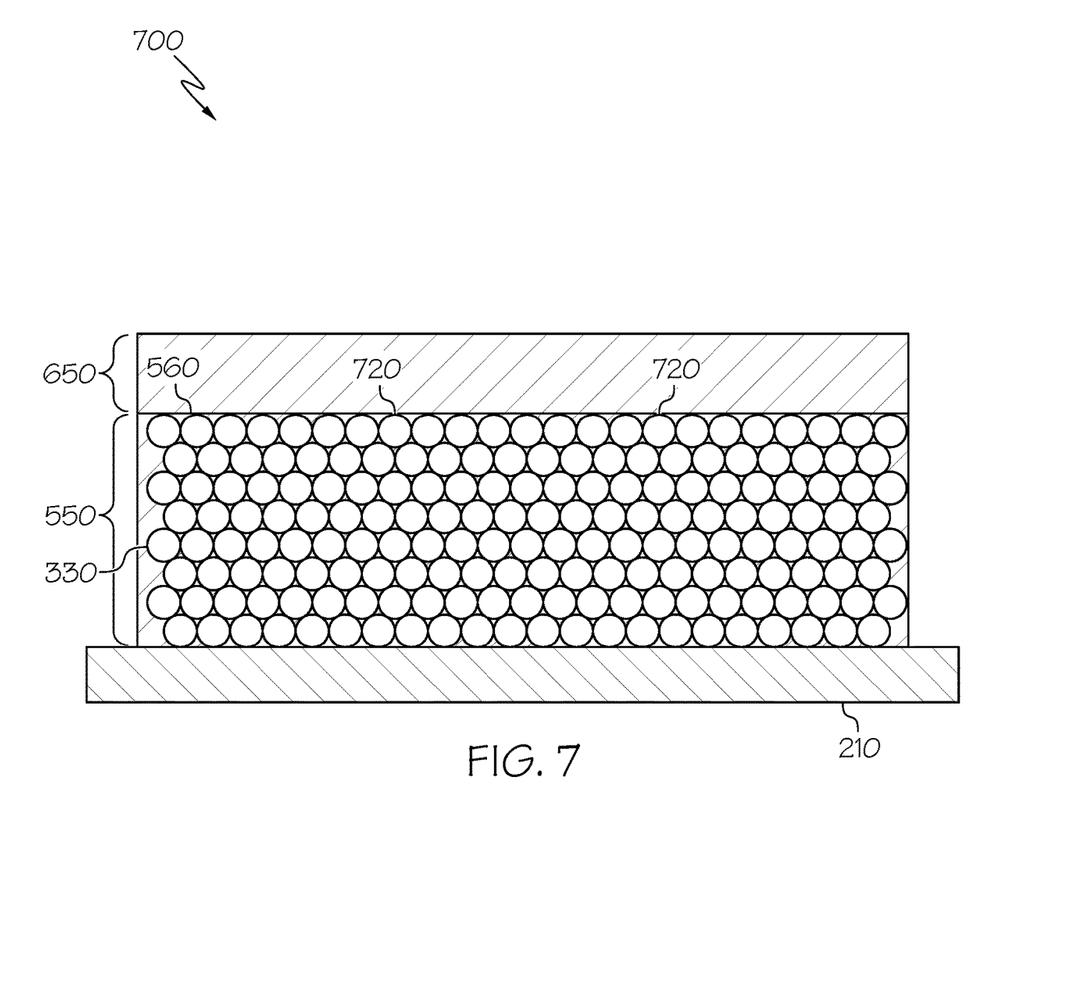
FIG. 7 depicts a method step of forming a plurality of voids within the MIO structure by removing the plurality of particles by dissolving in an organic solution, according to one or more embodiments shown and described herein.

In step 120, a metal is deposited onto the plurality of particles up to a desired level to form a metal layer such that the plurality of particles is partially covered by a metal layer. The example embodiment shown in FIG. 3 demonstrates this initial growth stage of the formation of the MIO structure 700. A metal 330 is deposited over the plurality of particles 220 to form a first intermediate structure 300. In some embodiments, the metal 330 may be an electrically-conductive metal such as, but not limited to, copper, nickel, aluminum, silver, zinc, magnesium, or alloys thereof. The metal 330 may be deposited by any suitable process such as, but not limited to, electrodeposition. As a non-limiting example, the platform on which the base substrate 210 is set may be passed through an electrodeposition apparatus for this purpose.

Figure 4:
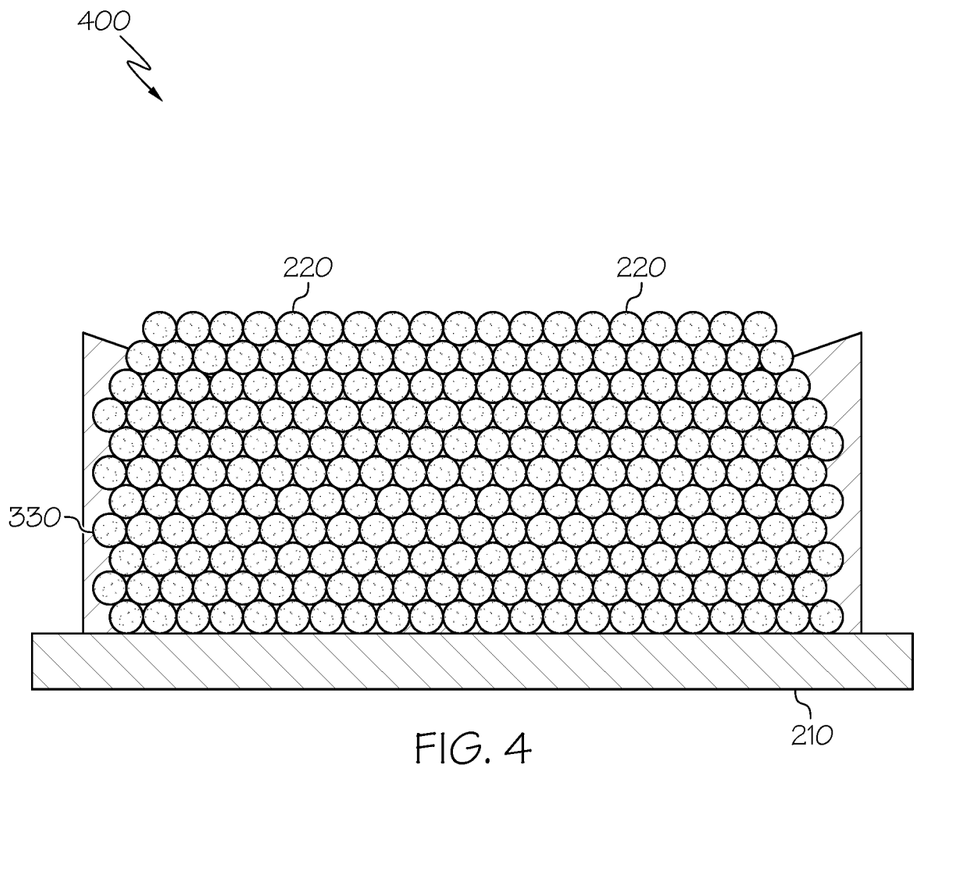
FIG. 4 depicts a method step of forming a metal layer over the plurality of particles such that the plurality of particles is partially covered by the metal layer, according to one or more embodiments shown and described herein.

As shown in FIG. 4, the plurality of particles 220 are partially covered by continued deposition of the metal 330 up to a desired level, thereby forming the metal layer 550 with a desired thickness. As a non-limiting example, the metal 330 is allowed to grow to a desired level at a growth rate of about 10 microns every five (5) minutes under a 10 mA current. During the deposition process, the particles 220 orient towards a central region over the base substrate 210. The growth of the metal 330 is stopped well before the plurality of particles 220 form an inverted cone-like structure 400 and become entirely covered with the deposited metal 330. The resultant surface of the metal layer 550 may be flat or slightly concave due to the deposition process and growth rate of the metal 330 around the plurality of particles 220. As a non-limiting example, a machine-operated arm of a second apparatus in the machinery may be used to stop the electrodeposition process. As a result, some of the plurality of particles 220 remain exposed above the metal layer 550 formed from the metal 330 (shown in FIG. 5). The extended sides shown in FIG. 4 even out as the metal layer 500 of FIG. 5 reaches a desired level of thickness.

In step 130, an adhesive member is applied to the plurality of particles 220 exposed above the metal layer. The example embodiment shown in FIG. 5 demonstrates this stage of the formation of the MIO structure 700 (shown in FIG. 7). An adhesive member 540 having a non-adhesive side 542 and an adhesive side 544 is applied over a second intermediate structure 500, where a plurality of particles 220 are exposed above the metal layer 550 formed from the metal 330. As a non-limiting example, this may be achieved by using a machine-operated arm of a third apparatus in the machinery. As discussed above with respect to FIG. 4, since the plurality of particles 220 tend to orient towards a central region over the base substrate 210 and form the inverted cone-like structure 400 during electrodeposition of the metal layer 330, it is particularly challenging to form a flat surface thereon.

Figure 5:
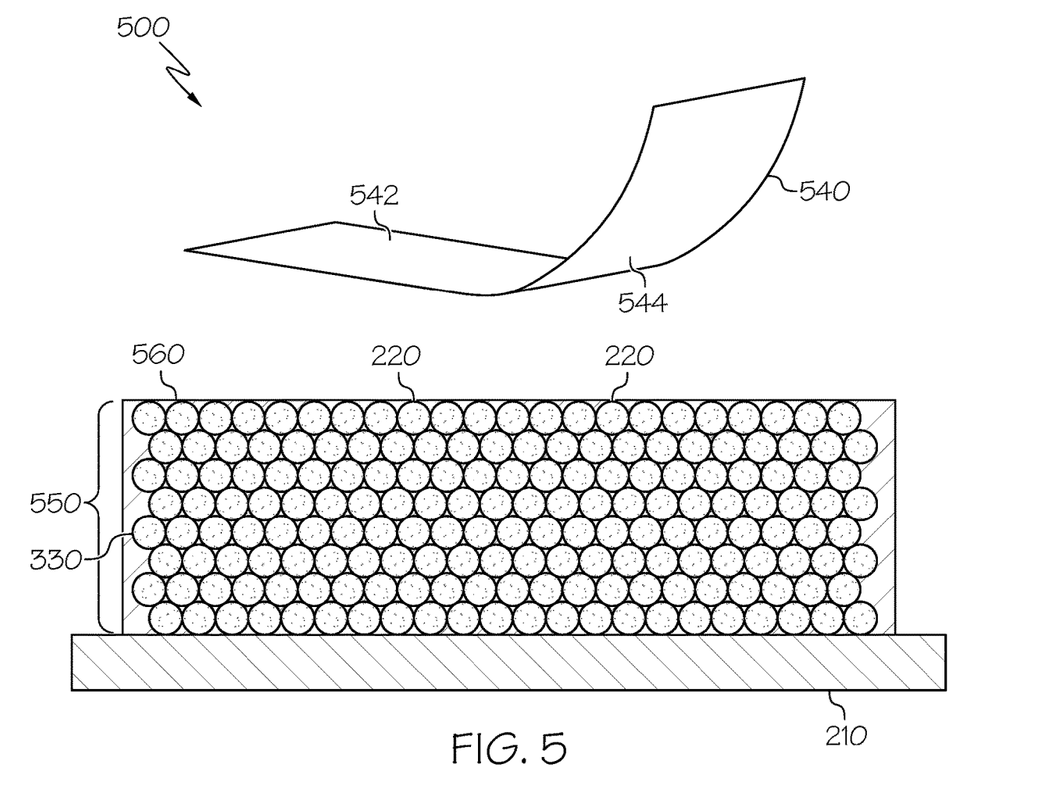
FIG. 5 depicts a method step of applying an adhesive member to the plurality of particles exposed above the metal layer, according to one or more embodiments shown and described herein.

In step 140, the adhesive member is pulled to remove any of the plurality of particles exposed above the metal layer. As shown in FIG. 5, the removal of the plurality of particles 220 exposed above the metal layer 550 results in the second intermediate structure 500 (shown in FIG. 5) having a substantially flat surface 560. The removal process using the adhesive member 540 is easy, simple and efficient due to the low weight and weak bonding among the plurality of particles 220 and may also be performed by the machine-operated arm of the third apparatus in the machinery, as a non-limiting example. Accordingly, the use of the adhesive member 540 confers a distinct cost-efficient advantage to remove the plurality of particles 220 exposed above the metal layer 550.

Figure 6:
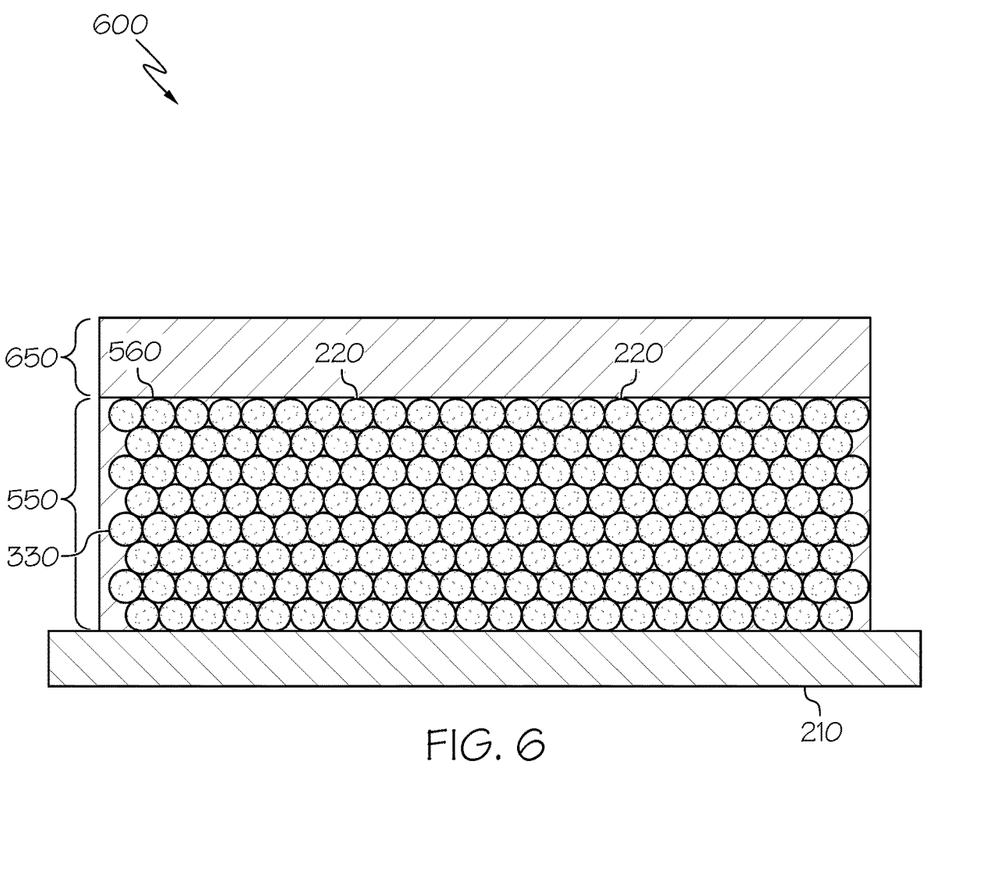
FIG. 6 depicts a method step of forming a cap layer with further deposition of the metal above the MIO structure, according to one or more embodiments shown and described herein.

After the formation of the second intermediate structure 500 having the substantially flat surface 560, a cap layer 650 may be formed over the metal layer 550 with further deposition of the metal 330 on the substantially flat surface 560 above the plurality of particles 220 to form a third intermediate structure 600, as shown in FIG. 6. As a non-limiting example, this may be achieved by passing the platform with the base substrate 210 through the electrodeposition apparatus again.

Subsequently, as shown in FIG. 7, the plurality of particles 220 within the third intermediate structure 600 are removed. This creates a plurality of voids 720 within the metal layer 550 to form the MIO structure 700. In some embodiments, this is achieved by dissolving the third intermediate structure 600 in an organic solution such as, but not limited to, toluene, acetone, tetrahydrofuran, or an etching solution. In the example embodiment shown in FIG. 7, the plurality of voids 720 in the MIO structure 700 is formed by dissolving the third intermediate structure 600 in a bath of an organic solvent listed above. This results in creation of the MIO structure 700 having the plurality of voids 720 and a cap layer 650 disposed on the substantially flat surface 560 (shown in FIG. 6). The plurality of voids 720 define a porosity of the MIO structure 700.

Figure 8:
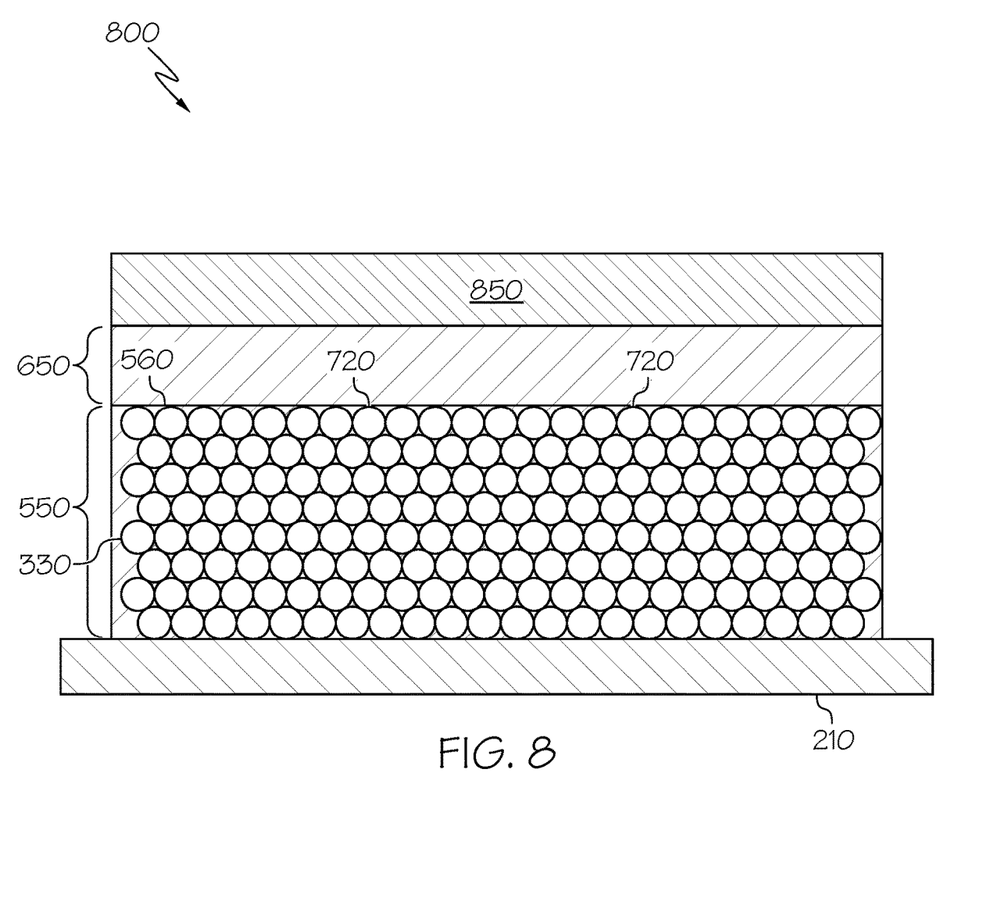
FIG. 8 depicts a method step of thermally coupling an electronic device to the cap layer, according to one or more embodiments shown and described herein.

In some embodiments, an electronic device 850 may be thermally coupled to the cap layer 650 to form an electronic assembly 800 as shown in FIG. 8. The MIO structure 700 having the metal layer 550 and the cap layer 650 acts as a cooling layer between the electronic device 850 and the base substrate 210. The electronic device 850 may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the electronic device 850 may include a wide-bandgap semiconductor, and may be formed from any suitable material such as, but not limited to, silicon carbide (SiC), aluminum nitride (AlN), gallium nitride (GaN), gallium oxide ($Ga_2O_3$), boron nitride (BN), diamond, and/or the like. In some embodiments, the electronic device 850 operates at high current and under high temperatures, for example in excess of 250° C.

The thickness of the electronic device 850 and the substrate 210 may depend on the intended use of the electronic assembly 800. In non-limiting examples, the electronic device 850 has a thickness between about 0.1 millimeters and about 0.3 millimeters, and the substrate 210 has a thickness between about 1.0 millimeter and about 2.0 millimeters. In this instance, the electronic assembly 800 may have a maximum height between about 1.1 millimeters and about 2.3 millimeters. It should be understood that other thicknesses of the electronic device 850 and/or the substrate 210 may be utilized in the electronic assembly 800 without departing from the scope of the present disclosure.

Figure 9:
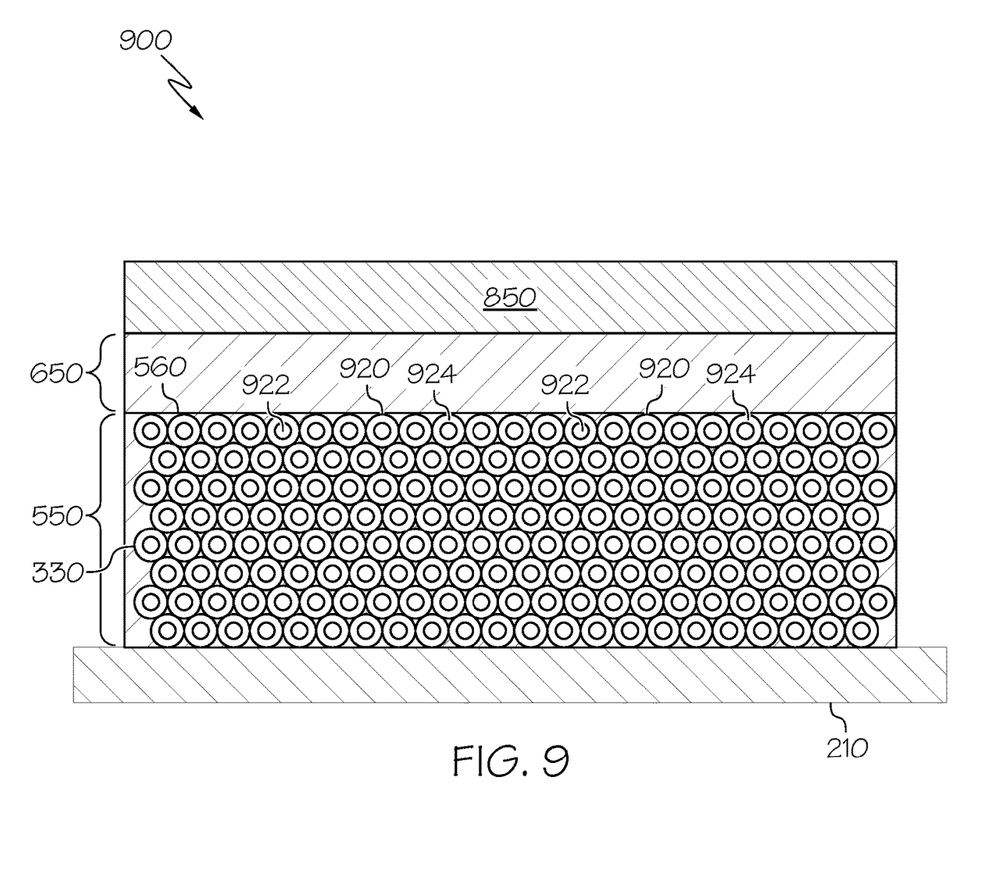
FIG. 9 depicts a flat surface MIO structure formed using a plurality of core-shell phase change (PC) particles instead of using a plurality of particles that are subsequently removed, according to one or more embodiments shown and described herein.

In some embodiments as shown in FIG. 9, the plurality of particles 220 in FIGS. 2-8 may be replaced with a plurality of core-shell phase change (PC) particles 920, where each core-shell PC particle 920 has a core 922 and a shell 924. The core 922 has a phase change material (PCM) with a melting point between about 100° C. and about 250° C., while the shell 924 has a shell material having a melting point greater than the melting point of the core and may comprise a metal oxide or an electrically insulating polymer.

In some embodiments, the PCM material may be tin, bismuth or paraffin wax. The cap layer 650 is formed on the flat surface 560, as described with respect to FIG. 6. In the embodiment shown in FIG. 9, the removal of the plurality of particles 220 to form the plurality of voids 720 within the metal layer 550 of the MIO structure 700 is not necessary. The presence of the plurality of core-shell PC particles 920 in the MIO structure 700 of an electronic assembly 900 increases its heat capacity and is capable of efficiently transferring heat from the electronic device 850 to the base substrate 210 at a high rate of heat removal during operation of the electronic device 850.

The MIO structure with a substantially flat surface described herein has a high permeability and the thermal conductivity can be varied and controlled to accommodate thermally-induced stresses generated within the electronic assembly of which it is a part of. The flat surface MIO structure can be advantageously used as a thermal management solution for electronic assemblies having high heat flux applications. In vehicular applications, this enables the electronic assemblies to be maintained within a suitable operating temperature range. The MIO structure having a substantially flat surface significantly reduces packaging size of electronic assemblies, especially the power electronic assemblies used as inverters in electric vehicles.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming a flat surface on an MIO structure, the method comprising:
  providing a plurality of particles on a surface of a base substrate, the plurality of particles comprise core-shell phase change (PC) particles, each of the core-shell phase change (PC) particles including:
    a core comprising a phase change material (PCM) with a melting point between about 100° C. and about 250° C., and
    a shell comprising a shell material having a different melting point greater than the melting point of the core, the shell material comprising a metal oxide or an electrically-insulating polymer;
  depositing a metal onto the plurality of particles up to a desired level to form a metal layer such that the plurality of particles is partially covered by the metal layer;
  applying an adhesive member to the plurality of particles exposed above the metal layer; and
  pulling the adhesive member to remove individual particles of the plurality of particles that are exposed above the metal layer.

2. The method of claim 1, wherein the plurality of particles comprise polystyrene.

3. The method of claim 1, wherein the metal of the MIO structure comprises copper, nickel, aluminum, silver, zinc, magnesium, or alloys thereof.

4. The method of claim 1, wherein the metal layer is deposited through electrodeposition.

5. The method of claim 1, further comprising forming a cap layer above the metal layer with further deposition of additional metal above the plurality of particles.

6. The method of claim 5, further comprising:
removing the plurality of particles to form a plurality of voids within the the metal layer using an organic solution.

7. The method of claim 6, wherein the organic solution is selected from one of:
toluene, acetone, tetrahydrofuran, and an etching solution.

8. The method of claim 6, further comprising thermally coupling an electronic device to the cap layer.

9. The method of claim 1, wherein the PCM comprises tin, bismuth or paraffin wax.

10. The method of claim 1, further comprising forming a cap layer above the metal layer with further deposition of additional metal above the plurality of particles.

11. A method of forming a flat surface on an MIO structure, the method comprising:
providing a plurality of polystyrene particles on a surface of a base substrate, the plurality of polystyrene particles comprise core-shell phase change (PC) particles, each of the core-shell phase change (PC) particles including:
a core comprising a phase change material (PCM) with a melting point between about 100° C. and about 250° C., and
a shell comprising a shell material having a different melting point greater than the melting point of the core, the shell material comprising a metal oxide or an electrically-insulating polymer;
electrodepositing a metal onto the plurality of polystyrene particles up to a desired level to form a metal layer such that the plurality of polystyrene particles is partially covered by the metal layer;
applying an adhesive member to the plurality of polystyrene particles exposed above the metal layer;
pulling the adhesive member to remove individual polystyrene particles of the plurality of polystyrene particles that are exposed above the metal layer for forming a plurality of voids; and
forming a cap layer above the metal layer with further deposition of additional metal above the plurality of voids.

12. The method of claim 11, wherein the metal of the MIO structure comprises copper, nickel, aluminum, silver, zinc, magnesium, or alloys thereof.

13. The method of claim 11, further comprising:
removing the plurality of polystyrene particles to form a plurality of voids within the metal layer using an organic solution.

14. The method of claim 13, wherein the organic solution is selected from one of: toluene, acetone, tetrahydrofuran, and an etching solution.

15. The method of claim 13, further comprising thermally coupling an electronic device to the cap layer.

16. A method of forming a flat surface on an MIO structure, the method comprising:
providing a plurality of particles on a surface of a base substrate;
electrodepositing a metal onto the plurality of particles up to a desired level to form a metal layer such that the plurality of particles is partially covered by the metal layer;
applying an adhesive member to the plurality of particles exposed above the metal layer;
pulling the adhesive member to remove individual particles of the plurality of particles that are exposed above the metal layer, wherein the plurality of particles comprise core-shell phase change (PC) particles, each core-shell PC particle comprising a core comprising a phase change material (PCM) with a melting point between about 100° C. and about 250° C. and a shell material having a melting point greater than the melting point of the core.

17. The method of claim 16, further comprising:
forming a cap layer above the metal layer with further deposition of additional metal above the plurality of particles; and
thermally coupling an electronic device to the cap layer.

18. The method of claim 16, further comprising thermally coupling an electronic device directly to a surface of the metal layer above the plurality of particles.

* * * * *

UNITED STATES PATENT AND TRADEMARK OFFICE
CERTIFICATE OF CORRECTION

| | | |
|---|---|---|
| PATENT NO. | : 11,319,639 B2 | Page 1 of 1 |
| APPLICATION NO. | : 16/777488 | |
| DATED | : May 3, 2022 | |
| INVENTOR(S) | : Shailesh N. Joshi, Paul Braun and Gaurav Singhal | |

It is certified that error appears in the above-identified patent and that said Letters Patent is hereby corrected as shown below:

On the Title Page

Item (73), Assignee, insert --THE BOARD OF TRUSTEES OF THE UNIVERSITY OF ILLINOIS, Champaign, IL (US)--.

In the Claims

In Column 7, Line(s) 11, Claim 6, delete "the the" and insert --the--, therefor.

Signed and Sealed this
Third Day of October, 2023

Katherine Kelly Vidal
*Director of the United States Patent and Trademark Office*